(12) United States Patent
Orlowski

(10) Patent No.: US 7,629,220 B2
(45) Date of Patent: Dec. 8, 2009

(54) METHOD FOR FORMING A SEMICONDUCTOR DEVICE AND STRUCTURE THEREOF

(75) Inventor: Marius Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 429 days.

(21) Appl. No.: 11/428,038

(22) Filed: Jun. 30, 2006

(65) Prior Publication Data
US 2008/0003725 A1 Jan. 3, 2008

(51) Int. Cl.
*H01L 21/336* (2006.01)
(52) U.S. Cl. .............................. 438/283; 257/E21.442
(58) Field of Classification Search ................ 438/283, 438/284; 257/E21.442
See application file for complete search history.

(56) References Cited

U.S. PATENT DOCUMENTS

| | | | |
|---|---|---|---|
| 6,458,662 B1 | 10/2002 | Yu | |
| 6,936,516 B1 | 8/2005 | Goo et al. | |
| 7,029,980 B2 | 4/2006 | Liu et al. | |
| 7,056,773 B2 * | 6/2006 | Bryant et al. | 438/142 |
| 2005/0093154 A1 * | 5/2005 | Kottantharayil et al. | 257/745 |
| 2005/0245092 A1 | 11/2005 | Orlowski et al. | |
| 2006/0042542 A1 | 3/2006 | Bedell et al. | |

OTHER PUBLICATIONS

Okano et al; "Process Integration Technology and Device Characteristics of CMOS FinFET on Bulk Silicon Substrate with sub-10nm Fin Width and 20nm Gate Length"; IEEE, 2005.
Tezuka et al; "Fabrication of strained Si on an ultrathin SiGe-on-insulator virtual substrate with a high-Ge fraction"; 2001 American Institute of Physics, Applied Physics Letter, vol. 79, No. 12, pp. 1798-1800.
Vyatkin et al; "Ion Beam Induced Strain Relaxtion in Pseudomorphous Epitaxial SiGe Layers"; IEEE 2000.
Sawano et al; "Relaxation Enhancement of SiGe Thin Layers by Ion Implantation into Si Substrates"; IEEE 2002.

* cited by examiner

*Primary Examiner*—Chandra Chaudhari
(74) *Attorney, Agent, or Firm*—Susan C. Hill (57) ABSTRACT

A non-planar semiconductor device (10) starts with a silicon fin (42). A source of germanium (e.g. 24, 26, 28, 30, 32) is provided to the fin (42). Some embodiments may use deposition to provide germanium; some embodiments may use ion implantation (30) to provide germanium; other methods may also be used to provide germanium. The fin (42) is then oxidized to form a silicon germanium channel region in the fin (36). In some embodiments, the entire fin (42) is transformed from silicon to silicon germanium. One or more fins (36) may be used to form a non-planar semiconductor device, such as, for example, a FINFET, MIGFET, Tri-gate transistor, or multi-gate transistor.

20 Claims, 7 Drawing Sheets

METHOD FOR FORMING A SEMICONDUCTOR DEVICE AND STRUCTURE THEREOF

RELATED APPLICATION

This is related to U.S. patent application Ser. No. 11/273,092 filed Nov. 14, 2005, and entitled "Electronic Devices Including A Semiconductor Layer And A Process for Forming The Same" and is assigned to the current assignee hereof.

FIELD OF THE INVENTION

The invention relates in general to semiconductor devices, and in particular to a method for forming a semiconductor device.

RELATED ART

Using silicon germanium materials in some silicon based semiconductor devices can provide a significant improvement in performance of the devices. For example, the silicon germanium materials may be used to increase the hole and electron mobility in the channel region of a transistor. An improved method for forming devices using silicon germanium materials is desired.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
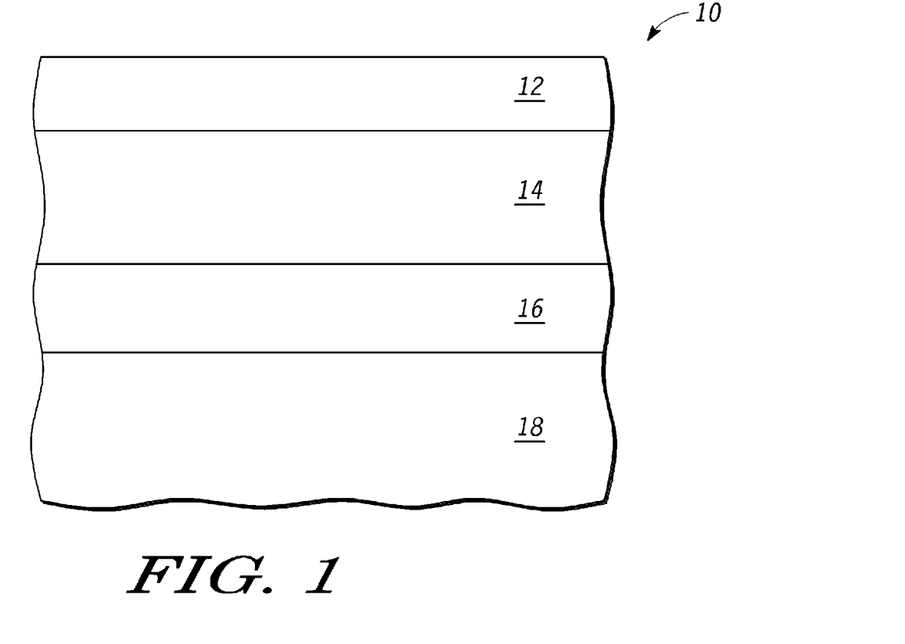
FIG. 1 is a cross-sectional view of a portion of a wafer during a stage in its manufacture in accordance with one embodiment.

FIG. 1 is a cross-sectional view of a portion of a wafer 10 during a stage in its manufacture in accordance with one embodiment. In one embodiment, wafer 10 comprises a substrate 18, a insulating layer 16 overlying substrate 18, a monocrystalline semiconductor layer 14 overlying layer 16, and an insulating layer 12 overlying layer 14. In one embodiment, substrate 18 is monocrystalline semiconductor material such as silicon.

Alternate embodiments may use other materials for substrate 18, such as, for example, sapphire, glass, or any other appropriate substrate material or combination or materials. In one embodiment, insulating layer 16 is a buried oxide layer (commonly called "BOX") comprising silicon dioxide. Alternate embodiments may use any suitable dielectric materials for layer 16, such as, for example, silicon nitride, metal oxides (e.g. hafnium oxide), or any plurality of layers of appropriate materials. In one embodiment, layer 14 is monocrystalline silicon on insulator (SOI) layer. In another embodiment layer 14 may be silicon carbon crystal (SiC) or any other semiconductor material with the appropriate properties. In one embodiment, insulating layer 12 comprises a capping layer of silicon nitride. Alternate embodiments may use any suitable dielectric materials for layer 12, such as, for example, metal oxides (e.g. hafnium oxide), or any plurality of layers of appropriate materials. In addition, alternate embodiments may include an oxide pad layer interposed between layers 14 and 16 (not shown). Alternate embodiments may not use insulating layer 12.

Figure 2:
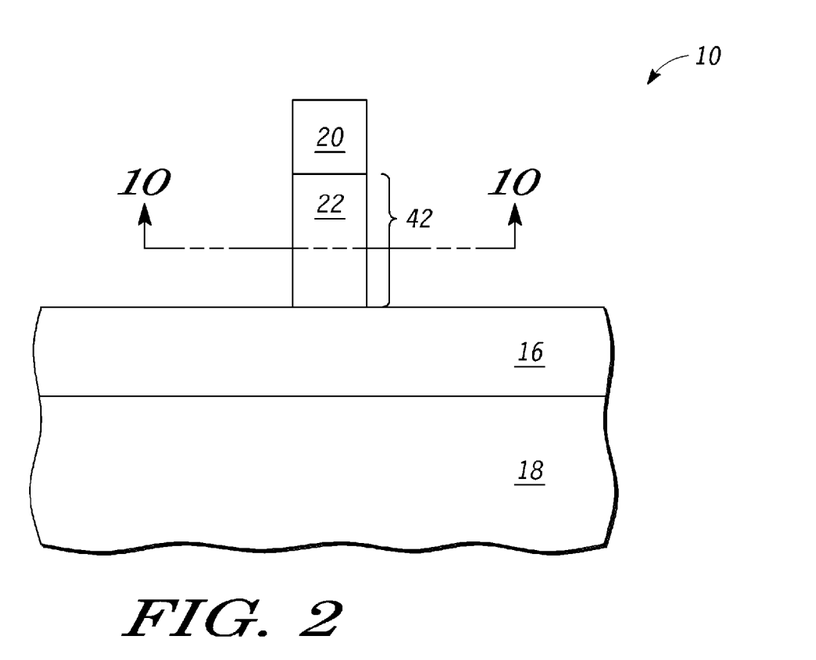
FIG. 2 is a cross-sectional view of a portion of a wafer during a stage in its manufacture in accordance with one embodiment.

FIG. 2 is a cross-sectional view of a portion of a wafer 10 of FIG. 1 after patterning layers 12 and 14 in accordance with one embodiment. The patterned portion of layer 14 is designated with reference number 22, and the patterned portion of layer 12 is designated with reference number 20. In one embodiment, structure 42 (formed of material 22) is a portion of a fin of a FINFET (fin field effect transistor), MIGFET (multiple independent gate field effect transistor), Tri-gate (three non-independent gates) device, or multi-gate (a plurality of non-independent gates) device. Note that in the case of a Tri-gate transistor, the region 20 may be removed and the geometry of region 22 (fin) may assume other aspect ratios (i.e. height vs. width) than those shown in FIGS. 2-7. In alternate embodiments, structure 22 may be a portion of a fin of a different type of device. FINFETs, MIGFETs, Tri-gates, and multi-gates are just three examples of non-planar devices that make use of a fin. In addition, although the illustrated embodiment only shows one fin, alternate embodiments may use any number of fins in the same device.

Figure 10:
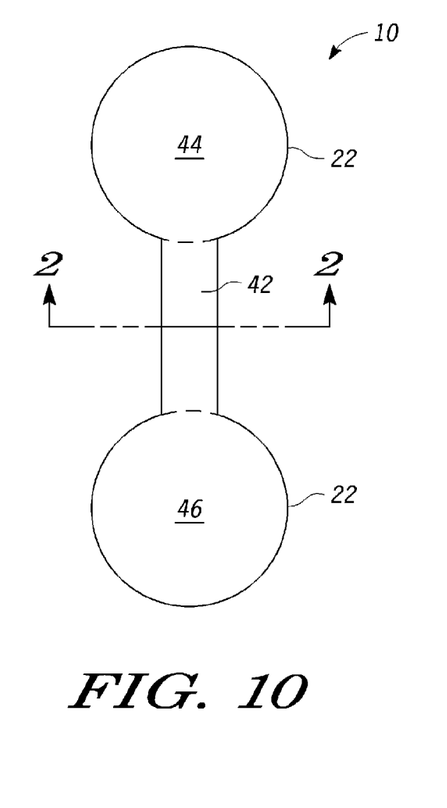
FIG. 10 is a top view of a portion of a wafer of FIG. 2 during a stage in its manufacture in accordance with one embodiment.

FIG. 10 is a top view of a portion of a wafer of FIG. 2 during a stage in its manufacture in accordance with one embodiment. FIG. 10 illustrates how fin 42 (comprised of material 22) may be coupled to a first current electrode 44 (comprised of material 22) and a second current electrode 46 (comprised of material 22). Although fin 42 has been shown as having an approximately rectangular shape, the first current electrode has been shown having an approximately circular shape, and the second current electrode has been shown having an approximately circular shape, alternate embodiments may use any desired shapes or geometries for structures 42, 44, and 46.

Note that the same reference numbers 42, 44, and 46 have been used for FIGS. 10-13 to represent that fin 42, first current electrode 44, and a second current electrode 46 still all serve the same functional purpose for device 10.

Figure 4:
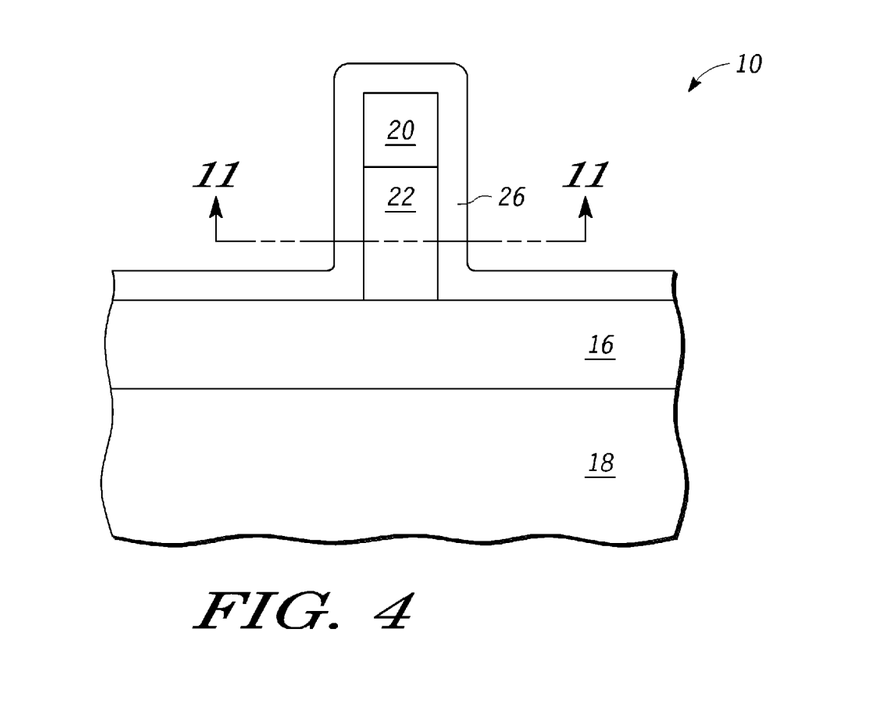
FIG. 4 is a cross-sectional view of a portion of a wafer of FIG. 2 during a stage in its manufacture in accordance with an alternate embodiment.
Figure 5:
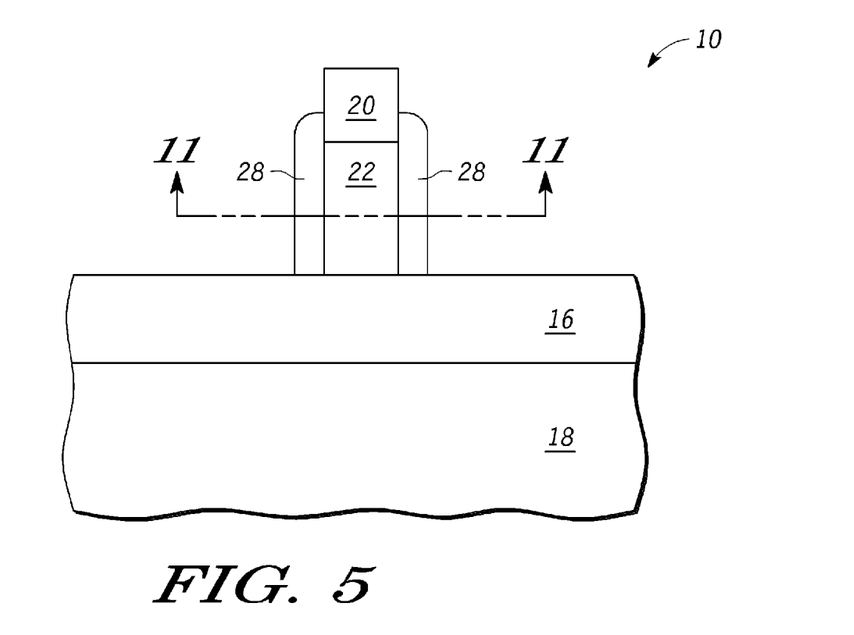
FIG. 5 is a cross-sectional view of a portion of a wafer of FIG. 4 during a stage in its manufacture in accordance with one embodiment.
Figure 6:
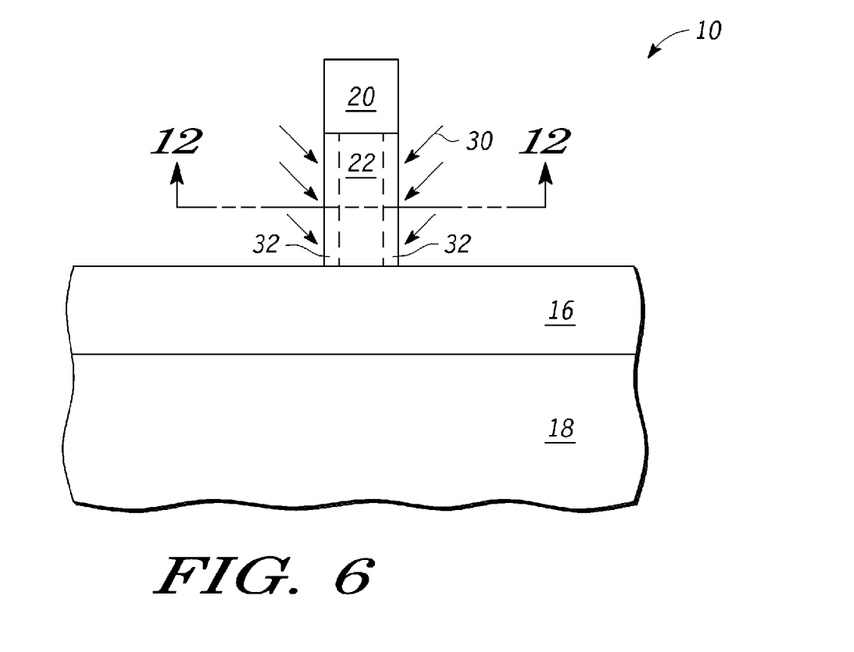
FIG. 6 is a cross-sectional view of a portion of a wafer of FIG. 2 during a stage in its manufacture in accordance with an alternate embodiment.
Figure 8:
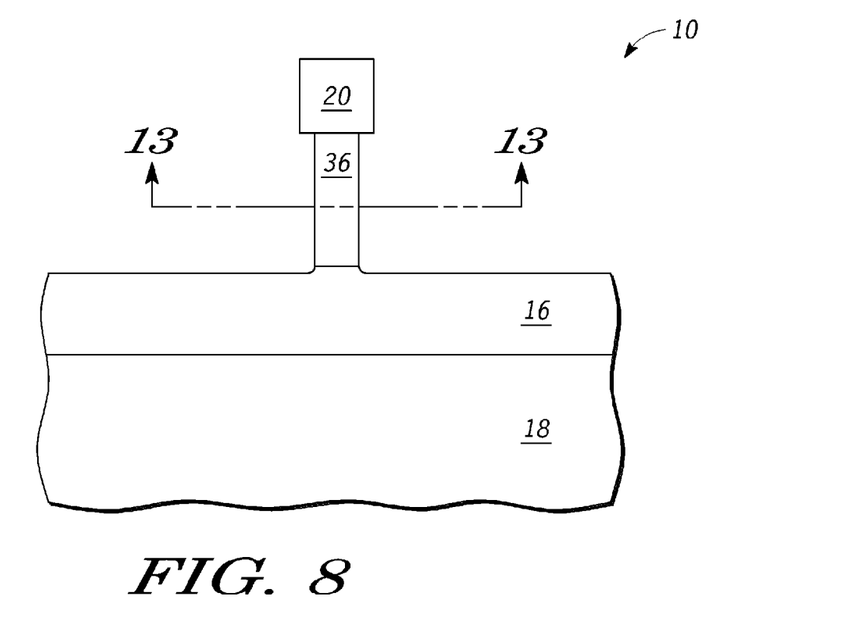
FIG. 8 is a cross-sectional view of a portion of a wafer of FIG. 7 during a stage in its manufacture in accordance with one embodiment.

In various embodiments, 42 may comprise 20 and 22 if it is a top view of FIGS. 2-5, 42 may comprise 20, 22, and 32 if it is a top view of FIG. 6, and 42 may comprise 20 and 36 if it is a top view of FIG. 8. In alternate embodiments, 42 may comprise fewer, more, or different layers than those illustrated.

Figure 3:
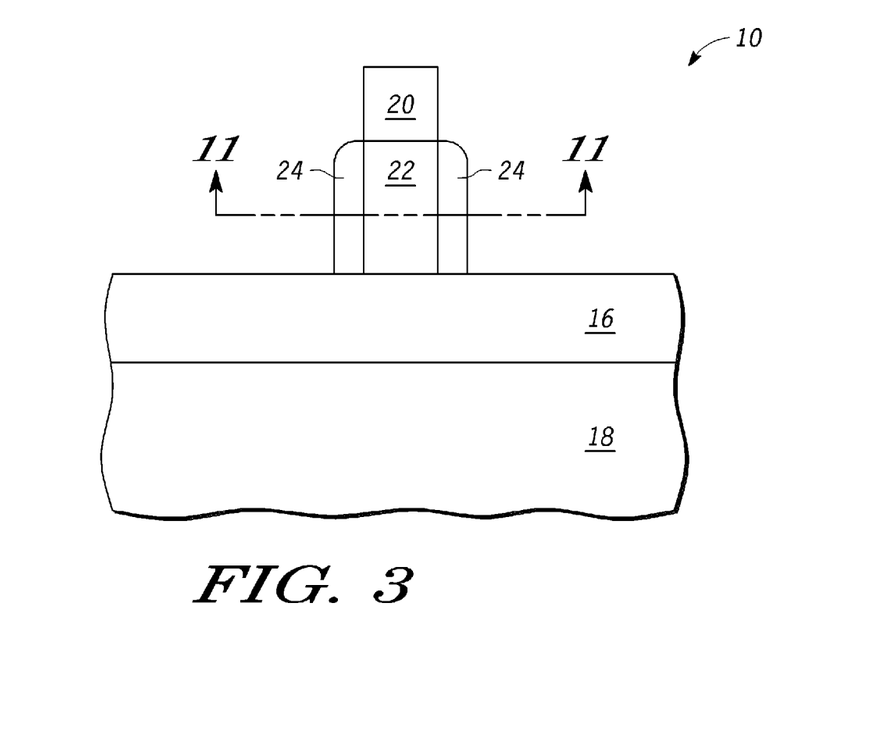
FIG. 3 is a cross-sectional view of a portion of a wafer during a stage in its manufacture in accordance with one embodiment.

FIG. 3 is a cross-sectional view of a portion of a wafer 10 of FIG. 2 during a stage in its manufacture in accordance with one embodiment. FIG. 3 illustrates wafer 10 after selective deposition of a semiconductor material 24. In one embodiment, the semiconductor material 24 comprises silicon germanium. Alternate embodiments may deposit any desired semiconductor material that has the necessary properties. In one embodiment, potentially a preferred embodiment, semiconductor material 24 may be monocrystalline. In alternate embodiments, semiconductor material 24 may be polycrystalline or amorphous.

FIG. 4 is a cross-sectional view of a portion of a wafer of FIG. 2 during a stage in its manufacture in accordance with an alternate embodiment. FIG. 4 illustrates wafer 10 after non-selective deposition of a semiconductor material 26. In one embodiment, the semiconductor material 26 comprises silicon germanium. Alternate embodiments may deposit any desired semiconductor material that has the necessary properties. In one embodiment, potentially a preferred embodiment, the portion of semiconductor material 26 in contact with semiconductor material 22 may be monocrystalline. In alternate embodiments, all or various portions of semiconductor material 26 may be polycrystalline or amorphous.

FIG. 5 is a cross-sectional view of a portion of a wafer of FIG. 4 during a stage in its manufacture in accordance with one embodiment. FIG. 5 illustrates wafer 10 of FIG. 4 after anisotropic etch of layer 26, leaving spacers 28 disposed on the sidewalls of the stack 22, 20. Any appropriate etch may be used, such as, for example, a plasma etch.

Figure 11:
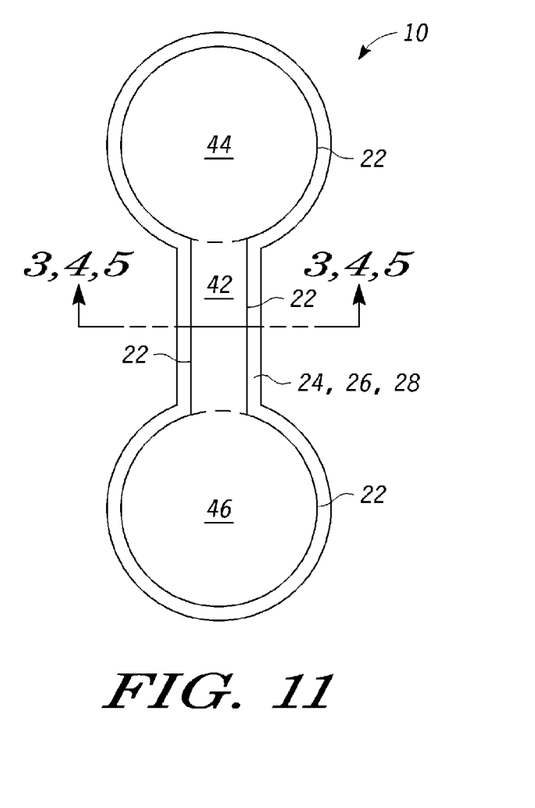
FIG. 11 is a top view of a portion of a wafer of FIG. 3, 4, 5, or 6 during a stage in its manufacture in accordance with one embodiment.

FIG. 11 is a top view of a portion of a wafer of FIG. 3, 4, 5, or 6 during a stage in its manufacture in accordance with one embodiment. FIG. 11 illustrates how fin 42 (comprised of material 22) may be coupled to a first current electrode 44 (comprised of material 22) and a second current electrode 46 (comprised of material 22). Note that in one embodiment, FIG. 11 differs from FIG. 10 in that semiconductor material 24 (see FIG. 3), semiconductor material 26 (see FIG. 4), or semiconductor material 28 (see FIG. 5) have been formed in contact with material 22 in FIG. 11.

FIG. 6 is a cross-sectional view of a portion of a wafer of FIG. 2 during a stage in its manufacture in accordance with an alternate embodiment. FIG. 6 illustrates wafer 10 of FIG. 2 after ion implantation 30 of wafer 10. In one embodiment, the ion implant species comprises germanium. Alternate embodiments may implant any desired semiconductor species that has the necessary properties. In one embodiment, the germanium atom dose may be in the range of $5 \times 10e14$ to $5 \times 10e15$. In an alternate embodiment, the germanium atom dose may be in the range of $5 \times 10e13$ to $5 \times 10e16$. Alternate embodiments may use any desired germanium atom dose. In one embodiment, the ion implant angle may be in the range of 30 degrees to 10 degrees (measured from the perpendicular to the primary wafer surface). In alternate embodiments, the ion implant angle may be in the range of 45 degrees to 5 degrees (again measured from the perpendicular to the primary wafer surface). In one embodiment, the ion implant energy may range from 5 keV to 80 keV. In an alternate embodiment, the implant energy may range from 1 keV to 120 keV. Alternate embodiments may use any desired ion implant energy.

Figure 7:
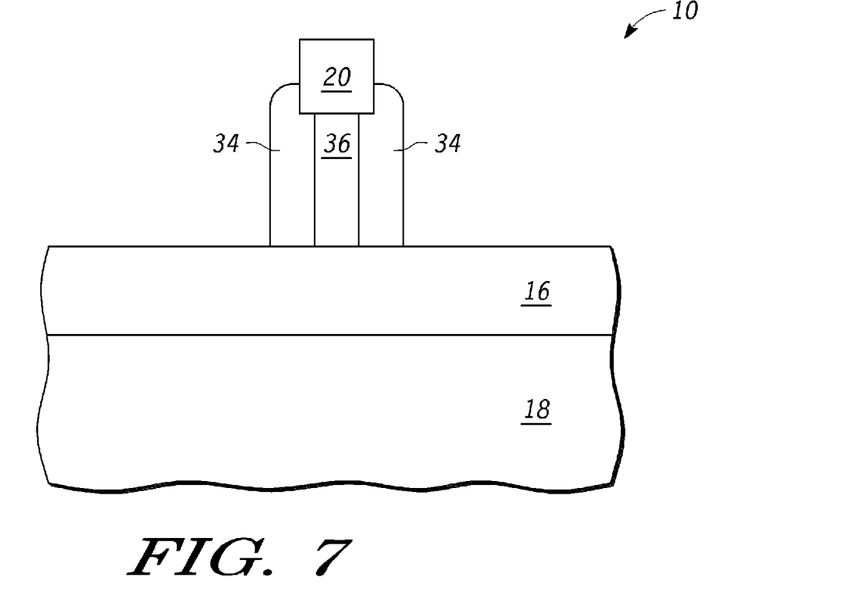
FIG. 7 is a cross-sectional view of a portion of a wafer of FIG. 5 during a stage in its manufacture in accordance with one alternate embodiment.

FIG. 7 is a cross-sectional view of a portion of a wafer of FIG. 5 during a stage in its manufacture in accordance with one alternate embodiment. FIG. 7 illustrates wafer 10 of FIG. 5 after oxidation where the spacers 28 have been transformed into the silicon oxide portions 34 during oxidation. Note that in the illustrated embodiment, the oxidation not only transforms spacers 28, but also may transform portions of material 22. During this oxidation step, germanium atoms from spacers 28 are injected into the remaining portion of material 22, transforming the original silicon material 22 into silicon germanium material 36. Note that oxidizing the fin allows a channel region comprising silicon germanium to be formed in the fin 36. In the illustrated embodiment, the channel region comprises all of fin 36 once the oxide is removed (see FIG. 8). Alternate embodiments may only form the channel region in a portion of fin 36. There are a wide variety of methods that may be used to perform oxidation, such as, for example, wet or steam oxidation, oxidation in hydrochloric acid ambient, or any other appropriate oxidation process. Note that the oxidation step may result in an effectively thinner fin 36, beyond what the lithographic capabilities of processing equipment may allow. For some embodiments, a thinner fin 36 may produce fully depleted devices which have improved performance characteristics.

Note that the embodiments of wafer 10 illustrated in FIGS. 3 and 6 may also be oxidized in the same or similar manner as illustrated in FIG. 7. However, note that the top of region 34 will be substantially level with the bottom of layer 20 for the embodiments illustrated in FIGS. 3 and 6.

Note that the embodiment of wafer 10 illustrated in FIG. 4 may be oxidized in the same or similar manner as illustrated in FIG. 7. However, note that the entire layer 26 may be transformed into silicon oxide.

FIG. 8 is a cross-sectional view of a portion of a wafer of FIG. 7 during a stage in its manufacture in accordance with one embodiment. FIG. 8 illustrates the wafer of FIG. 7 after removal of the silicon oxide 34. Note that for some embodiments, the etch process used to remove silicon oxide 34 may also cause erosion of the top portion of layer 16 if layer 16 is silicon oxide. In some embodiments, this erosion may be desirable due to better uniformity of gate strength across the entire fin channel.

Figure 9:
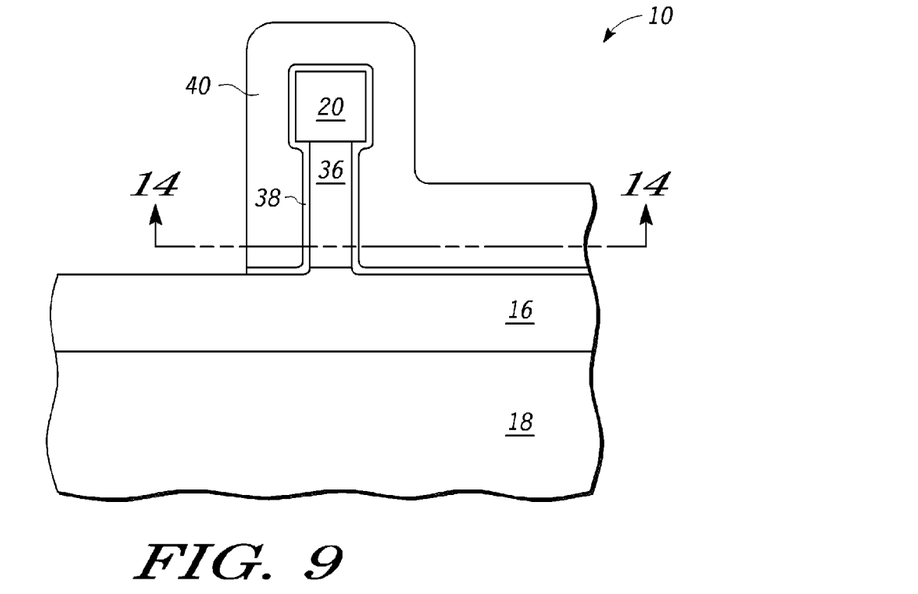
FIG. 9 is a cross-sectional view of a portion of a wafer of FIG. 3, 4, 5 or 6 during a stage in its manufacture in accordance with one embodiment.

FIG. 9 is a cross-sectional view of a portion of a wafer of FIG. 3, 4, 5 or 6 during a stage in its manufacture in accordance with one embodiment. FIG. 9 illustrates one finished device 10, namely a FINFET transistor, that may use the structure of FIG. 8. In the illustrated embodiment of device 10, a gate dielectric layer 38 is disposed over stack 36 and 20. In the illustrated embodiment, the gate dielectric layer 38 may be deposited by PVD (physical vapor deposition), ALD (atomic layer deposition), or CVD (chemical vapor deposition). For PVD, ALD, and CVD, a variety of dielectrics may be deposited, such as, for example, metal oxides such as hafnium oxide, zirconium oxide, tantalum oxide, or any combination of any appropriate oxides, including oxides containing silicon and/or nitride. Alternately, dielectric layer 38 may be grown on only the sidewalls of 36 by using conventional gate oxidation processes. Still referring to FIG. 9, the gate electrode may be deposited by CVD or PVD, and may include any appropriate gate materials, such as, for example, polysilicon, metal, metal silicide, or any combination of appropriate conductive materials. Note that the processing required to go from FIG. 8 to FIG. 9 may be performed using any known and appropriate techniques.

Figure 12:
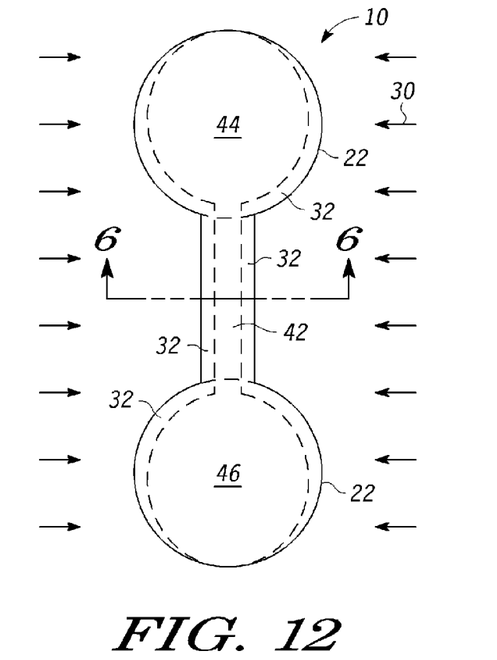
FIG. 12 is a top view of a portion of a wafer of FIG. 6 during a stage in its manufacture in accordance with one embodiment.

FIG. 12 is a top view of a portion of a wafer of FIG. 6 during a stage in its manufacture in accordance with one embodiment. Note that 32 illustrates the depth of the implantation profile. Alternate embodiments may use a different implantation profile.

Figure 13:
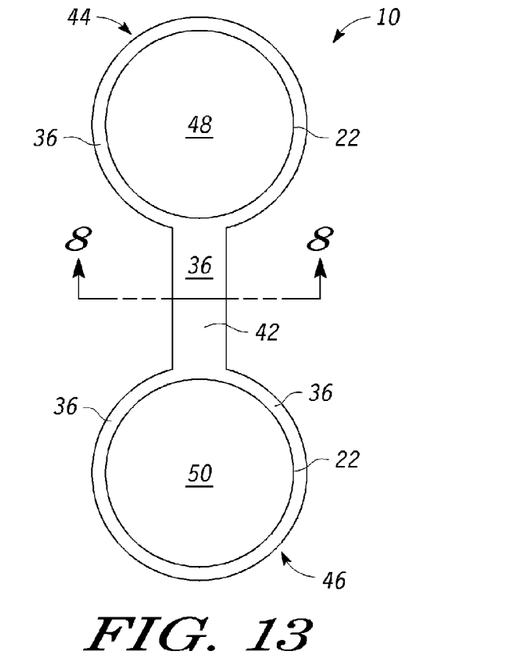
FIG. 13 is a top view of a portion of a wafer of FIG. 8 during a stage in its manufacture in accordance with one embodiment.

FIG. 13 is a top view of a portion of a wafer of FIG. 8 during a stage in its manufacture in accordance with one embodiment. Note that the oxidation process has transformed region 36 into silicon germanium, while the regions 48 and 50 remain silicon material. The first current electrode 44 comprises material 48 (e.g. silicon) and the portion of 36 (e.g. silicon germanium) surrounding 48. The second current electrode 46 comprises material 50 (e.g. silicon) and the portion of 36 (e.g. silicon germanium) surrounding 50. In one embodiment of the present invention, the fin (the portion of 36 between the first current electrode 44 and the second current electrode 46) is contiguous with the outer layer or region 36 surrounding region 48, and is also contiguous with the outer layer or region 36 surrounding region 50.

Note that in one embodiment, the oxidation process produces an outer region 36 of a first current electrode 44 that comprises germanium while the inner region 48 of the first current electrode 44 is substantially free of germanium. Although the diffusion of the germanium which occurs during the oxidation process may result in a small amount of germanium diffusing into the inner region 48, inner region 48 remains substantially free of germanium compared to the outer region 36. Note that in one embodiment, the oxidation process produces an outer region 36 of a second current electrode 46 that comprises germanium while the inner region 50 of the second current electrode 46 is substantially free of germanium. Although the diffusion of the germanium which occurs during the oxidation process may result in a small amount of germanium diffusing into the inner region 50, inner region 50 remains substantially free of germanium compared to the outer region 36.

Figure 14:
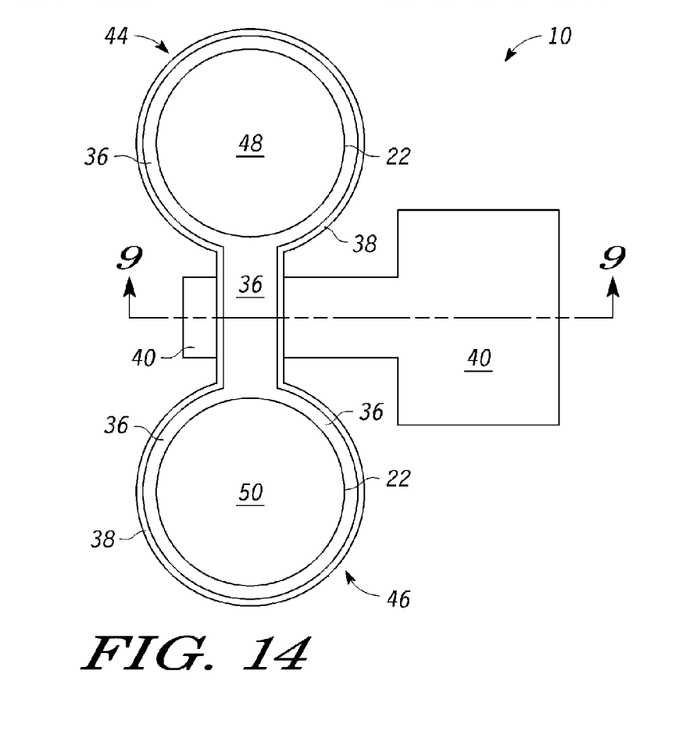
FIG. 14 is a top view of a portion of a wafer of FIG. 9 during a stage in its manufacture in accordance with one embodiment.

FIG. 14 is a top view of a portion of a wafer of FIG. 9 during a stage in its manufacture in accordance with one embodiment. Note that the oxidation process has transformed region 36 into silicon germanium, while the regions 48 and 50 remain silicon material. The first current electrode 44 comprises material 48 (e.g. silicon) and the portion of 36 (e.g. silicon germanium) surrounding 48. The second current electrode 46 comprises material 50 (e.g. silicon) and the portion of 36 (e.g. silicon germanium) surrounding 50. Note that layer 38 is a dielectric layer and 40 is a gate electrode.

Figure 15:
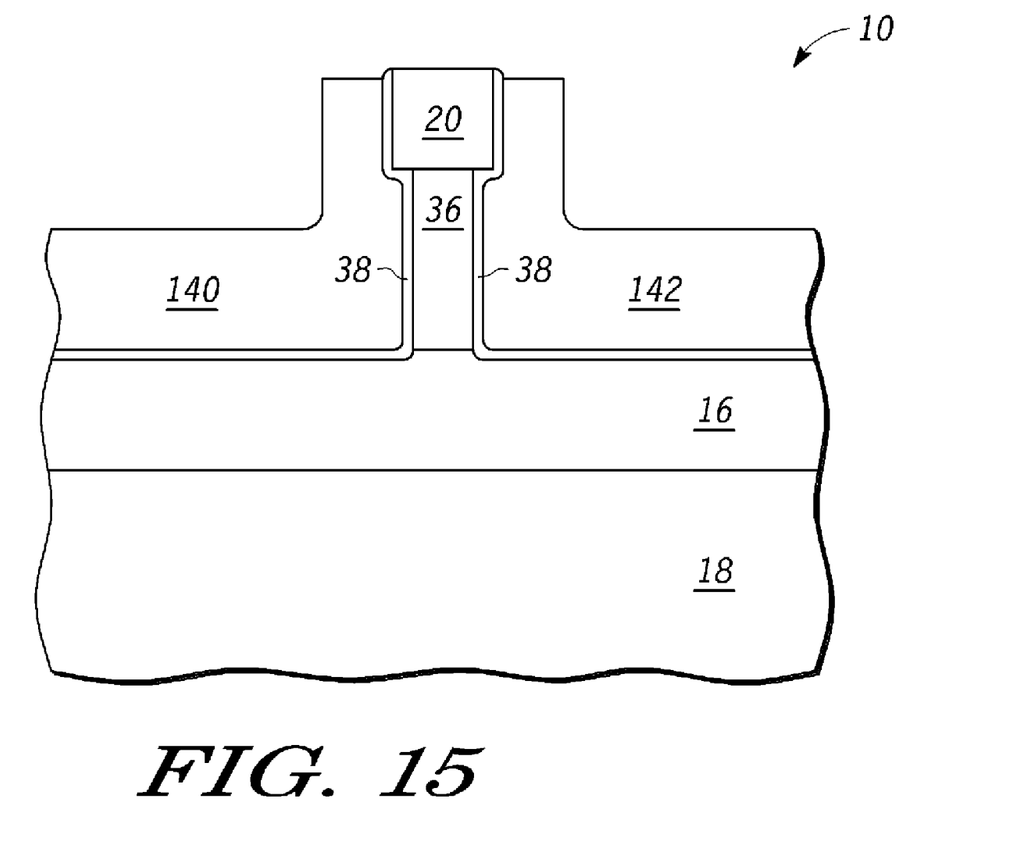
FIG. 15 is a cross-sectional view of a portion of a wafer of FIG. 3, 4, 5, or 6 during a stage in its manufacture in accordance with an alternate embodiment.

FIG. 15 is a cross-sectional view of a portion of a wafer of FIG. 3, 4, 5, or 6 during a stage in its manufacture in accordance with an alternate embodiment. FIG. 15 illustrates one finished device 10, namely a MIGFET transistor, that may use the structure of FIG. 8. In the illustrated embodiment of device 10, a gate dielectric layer 38 is disposed over stack 36 and 20. In the illustrated embodiment, the gate dielectric layer 38 may be deposited by PVD (physical vapor deposition), ALD (atomic layer deposition), or CVD (chemical vapor deposition). For PVD, ALD, and CVD, a variety of dielectrics may be deposited, such as, for example, metal oxides such as hafnium oxide, zirconium oxide, tantalum oxide, or any combination of any appropriate oxides, including oxides containing silicon and/or nitride. Alternately, dielectric layer 38 may be grown on only the sidewalls of 36 by using conventional gate oxidation processes.

Still referring to FIG. 15, the gate electrode may be deposited by CVD or PVD, and may include any appropriate gate materials, such as, for example, polysilicon, metal, metal silicide, or any combination of appropriate conductive materials. In one embodiment, the independent gate electrode portions 140 and 142 of gate electrode 40 may be formed by using a CMP (chemical mechanical polishing) process on gate electrode 40. Alternate embodiments may use any other desired and appropriate process to form the independent gate electrode portions 140 and 142. Note that by using CMP, the portion of gate electrode 40 overlying layer 20 is removed, resulting in two electrically independent gate electrode portion 140 and 142. The processing required to go from FIG. 8 to FIG. 15 may be performed using any known and appropriate techniques.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a non-planar semiconductor device, comprising:
    forming a fin, a first current electrode, and a second current electrode of the non-planar semiconductor device, wherein the fin, the first current electrode, and the second current electrode each comprises silicon;
    providing a source of germanium to the fin, to the first current electrode, and to the second current electrode, wherein providing the source of germanium to the fin comprises implanting the fin with germanium;
    oxidizing to distribute the germanium throughout the fin, to form an inner region and an outer region of the first current electrode, and to form an inner region and an outer region of the second current electrode, wherein the outer region of the first electrode comprises germanium but the inner region of the first electrode does not comprise germanium, and wherein the outer region of the second current electrode comprises germanium but the inner region of the second electrode does not comprise germanium; and completing formation of the non-planar semiconductor device.

2. A method as in claim 1, wherein implanting the fin with germanium comprises using an implant angle in a range of 30 degrees to 10 degrees.

3. A method as in claim 1, wherein said step of implanting the fin with germanium comprises:
using a germanium atom dose in a range of 5×10e13 to 5×10e16.

4. A method as in claim 1, wherein said step of implanting the fin with germanium comprises:
using an ion implant energy in a range of 1 keV to 120 keV.

5. A method as in claim 1, wherein said step of providing the source of germanium to the fin comprises:
forming a silicon germanium layer on the sidewalls of the fin.

6. A method as in claim 1, wherein an insulating layer overlies at least a portion of the fin.

7. A method as in claim 1, wherein the non-planar semiconductor device is formed using a wafer portion comprising a first insulating layer overlying a substrate, a monocrystalline semiconductor layer overlying the first insulating layer, and a second insulating layer overlying the monocrystalline semiconductor layer.

8. A method as in claim 1, further comprising:
after said step of forming the fin and before said step of providing the source of germanium, forming a silicon nitride layer overlying the fin.

9. A method as in claim 1, further comprising:
after said step of oxidizing the fin, etching at least a portion of silicon dioxide formed during the oxidation step.

10. A method as in claim 1, wherein the channel region comprises all of the fin.

11. A method as in claim 1, wherein the non-planar semiconductor device comprises a FINFET.

12. A method as in claim 1, wherein the non-planar semiconductor device comprises a MIGFET.

13. A method as in claim 1, wherein the non-planar semiconductor device comprises a Tri-gate transistor.

14. A method for forming a non-planar semiconductor device, comprising:
forming a fin, a first current electrode, and a second current electrode of the non-planar semiconductor device, wherein the fin, the first current electrode, and the second current electrode each comprises silicon;
providing a source of germanium to the fin, to the first current electrode, and to the second current electrode;
oxidizing to distribute the germanium throughout the fin, to form an inner region and an outer region of the first current electrode, and to form an inner region and an outer region of the second current electrode, wherein the outer region of the first electrode comprises germanium but the inner region of the first electrode does not comprise germanium, and wherein the outer region of the second current electrode comprises germanium but the inner region of the second electrode does not comprise germanium; and
completing formation of the non-planar semiconductor device.

15. A method as in claim 14, further comprising:
removing at least a portion of an oxide formed during said step of oxidizing.

16. A method as in claim 14, wherein the non-planar semiconductor device comprises a FINFET.

17. A method as in claim 14, wherein the non-planar semiconductor device comprises a MIGFET.

18. A method for forming a non-planar semiconductor device, comprising:
forming a fin, a first current electrode, and a second current electrode of the non-planar semiconductor device, wherein the fin, the first current electrode, and the second current electrode each comprises silicon;
providing a source of germanium to the fin, to the first current electrode, and to the second current electrode;
oxidizing to distribute the germanium throughout the fin, to form an inner region and an outer region of the first current electrode, and to form an inner region and an outer region of the second current electrode, wherein the outer region of the first electrode comprises germanium but the inner region of the first electrode does not comprise germanium, and wherein the outer region of the second current electrode comprises germanium but the inner region of the second electrode does not comprise germanium; and
completing formation of the non-planar semiconductor device,
wherein the non-planar semiconductor device is formed using a wafer portion comprising a first insulating layer overlying a substrate, a monocrystalline semiconductor layer overlying the first insulating layer, and a second insulating layer overlying the monocrystalline semiconductor layer.

19. A method as in claim 18, wherein said step of providing the source of germanium to the fin comprises forming a silicon germanium layer on the sidewalls of the fin, and wherein said step of forming the silicon germanium layer on the sidewalls of the fin comprises deposition of silicon germanium.

20. A method as in claim 19, wherein the deposition of silicon germanium is selective.

* * * * *

UNITED STATES PATENT AND TRADEMARK OFFICE
CERTIFICATE OF CORRECTION

PATENT NO. : 7,629,220 B2
APPLICATION NO. : 11/428038
DATED : December 8, 2009
INVENTOR(S) : Orlowski It is certified that error appears in the above-identified patent and that said Letters Patent is hereby corrected as shown below:

Title page, item (56), under "Other Publications", in Column 2, Line 8, delete "Relaxtion" and insert -- Relaxation --.

Column 6, line 62, in Claim 1, delete "first electrode" and insert -- first current electrode --.

Column 6, line 63, in Claim 1, delete "first electrode" and insert -- first current electrode --.

Column 6, line 66, in Claim 1, delete "second electrode" and insert -- second current electrode --.

Column 8, line 1, in Claim 14, delete "first electrode" and insert -- first current electrode --.

Column 8, line 2, in Claim 14, delete "first electrode" and insert -- first current electrode --.

Column 8, line 5, in Claim 14, delete "second electrode" and insert -- second current electrode --.

Column 8, line 28, in Claim 18, delete "first electrode" and insert -- first current electrode --.

Column 8, line 29, in Claim 18, delete "first electrode" and insert -- first current electrode --.

Column 8, line 32, in Claim 18, delete "second electrode" and insert -- second current electrode --.

Signed and Sealed this
Eighth Day of May, 2012

David J. Kappos
*Director of the United States Patent and Trademark Office*